United States Patent [19]

Ishii

[11] 4,445,054
[45] Apr. 24, 1984

[54] FULL-WAVE RECTIFYING CIRCUIT

[75] Inventor: Jun Ishii, Yokohama, Japan

[73] Assignee: Tokyo Shibaura Denki Kabushiki Kaisha, Kawasaki, Japan

[21] Appl. No.: 305,355

[22] Filed: Sep. 24, 1981

[30] Foreign Application Priority Data

Sep. 29, 1980 [JP] Japan ................... 55-135518

[51] Int. Cl.³ .............. H03K 5/08; H03K 5/13; G06G 7/20
[52] U.S. Cl. ................... 307/555; 307/492; 328/145; 328/26; 330/288
[58] Field of Search .......... 307/490, 492; 328/26, 328/145; 330/257, 288

[56] References Cited

U.S. PATENT DOCUMENTS

| | | | |
|---|---|---|---|
| 4,049,977 | 9/1977 | Radovsky | 330/288 |
| 4,057,743 | 11/1977 | Limberg | 330/288 |
| 4,187,537 | 2/1980 | Avicola et al. | 328/26 |
| 4,267,521 | 5/1981 | Yokoyama | 330/288 |
| 4,322,691 | 3/1982 | Malchow | 330/288 |
| 4,335,360 | 6/1982 | Hoover | 330/288 |

FOREIGN PATENT DOCUMENTS

| | | |
|---|---|---|
| 2631161 | 10/1977 | Fed. Rep. of Germany . |
| 3010856 | 10/1980 | Fed. Rep. of Germany . |
| 1431481 | 4/1976 | United Kingdom . |
| 1480528 | 7/1977 | United Kingdom . |
| 1492814 | 11/1977 | United Kingdom . |
| 2045025 | 10/1980 | United Kingdom . |

Primary Examiner—John S. Heyman
Assistant Examiner—Timothy P. Callahan
Attorney, Agent, or Firm—Cushman, Darby & Cushman

[57] ABSTRACT

A full-wave rectifying circuit includes a first current conducting path for conducting a current corresponding to a positive input voltage applied to an input terminal, a second current conducting path for conducting a current corresponding to a negative input voltage applied to the input terminal, and a current mirror circuit which is connected to the first and second current paths and which supplies, to a third current conducting path including a resistor, a current corresponding to a current flowing through either said first and second current paths.

11 Claims, 4 Drawing Figures

FULL-WAVE RECTIFYING CIRCUIT

BACKGROUND OF THE INVENTION

The present invention relates to a full-wave rectifying circuit.

The use of a level sensor with a dynamic range as wide as 100 dB is generally known in a noise reduction system. FIG. 1 shows an example of a level sensor of this type. This level sensor has a logarithmic amplifier 10 for receiving an input signal through a resistor; amplifiers 12 and 14 for multiplying an output signal from the logarithmic amplifier 10, by +2 and −2, respectively; and diodes 16 and 18 whose anodes are connected to output terminals of the respective amplifiers 12 and 14 and whose cathodes are commonly connected. The output signals from the amplifiers 12 and 14 combined by the diodes 16 and 18 are supplied to a smoothing circuit 20 formed of a capacitor and a resistor, where they are smoothed to provide a DC output signal.

In this level sensor, an offset voltage is generated at the amplifiers 12 and 14 so that the DC components of the signals supplied to the diodes 16 and 18 may have different values. Disregarding the smoothing circuit 20, the combined output signals from the diodes 16 and 18 become offset every half cycle as shown in FIG. 2. When the offset in the combined output signals is great, the error in the output signal is great. Additionally, when the output signal is smoothed by the smoothing circuit 20, a large ripple component is superposed on the DC output signal. Furthermore, since the amplifiers 12 and 14 are of low gain type, it becomes difficult to compensate for the phase shift between the input and output voltages. It becomes thus necessary to use a capacitor of great capacitance to compensate for this phase shift, making the integrated circuit bulky and costly.

SUMMARY OF THE INVENTION

It is an object of the present invention to provide a full-wave rectifying circuit in which the adverse effects of an offset voltage of the amplifiers may be reduced to the minimum.

According to an aspect of the present invention, there is provided a full-wave rectifying circuit comprising a first current conducting path which is connected to an input terminal to conduct a current corresponding to a signal component of one polarity of an input signal supplied to the input terminal, a resistive means, a current mirror circuit which is connected to the first current conducting path and the resistive means to conduct a current equal to the current flowing through the first current conducting path, and a second current conducting path which is connected to the input terminal to conduct a current corresponding to a signal component of the opposite polarity of the input signal supplied to the input terminal.

According to the present invention, a current is made to flow through the first current conducting path in correspondence with at least one polarity of the input signal, for example, a negative signal component. A current equal to the current flowing through the first current conducting path is made to flow through a resistor, and an output signal corresponding to the signal component of the same polarity as described above is obtained across the resistor. In this manner, an output signal which does not substantially include an offset voltage and which corresponds to the signal component of one polarity may be obtained across the resistor.

DETAILED DESCRIPTION OF THE PREFERRED EMBODIMENTS

Figure 1:
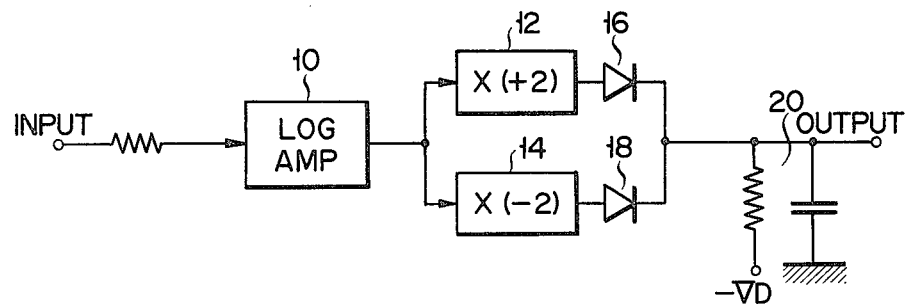
FIG. 1 is a circuit diagram showing a conventional level sensing circuit.
Figure 3:
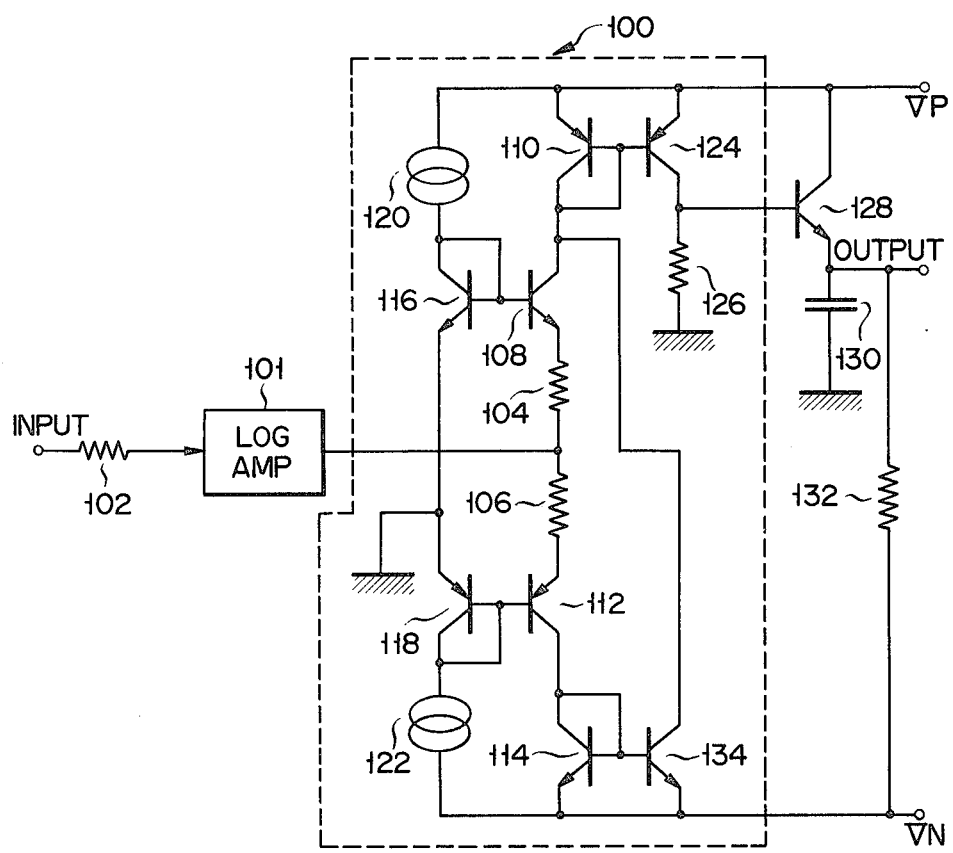
FIG. 3 is a circuit diagram of a level sensing circuit having a full-wave rectifying circuit according to an embodiment of the present invention.
Figure 2:
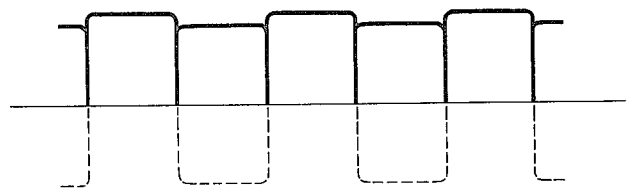
FIG. 2 shows the signal waveform for explaining the adverse effects of an offset voltage in the amplifiers used in the level sensing circuit shown in FIG. 1.

FIG. 3 is a circuit diagra of a level sensing circuit with a full-wave rectifying circuit 100 according to an embodiment of the present invention. This level sensing circuit has a logarithmic amplifier 101 which receives an input signal VIN through a resistor 102 and supplies an output signal logVIN corresponding to the logarithm of the input signal VIN to the full-wave rectifying circuit 100. The full-wave rectifying circuit 100 has resistors 104 and 106, one end of each of which is connected to the output terminal of the logarithmic amplifier 101. The other end of the resistor 104 is connected to a positive power source terminal VP through emitter-collector paths of an npn transistor 108 and a pnp transistor 110. The other end of the resistor 106 is connected to a negative power source terminal VN through emitter-collector paths of a pnp transistor 112 and an npn transistor 114. The bases of the transistors 108 and 112 are respectively connected to the bases of an npn transistor 116 and a pnp transistor 118, whose emitters are grounded. The collector of the transistor 116 is connected to the base thereof, as well as to the positive power source terminal VP through a constant current source 120. The collector of the transistor 118 is connected to the base thereof, as well as to the negative power source terminal VN through a constant current source 122. The base of the transistor 110 is connected to the collector thereof, as well as to the base of a pnp transistor 124 whose emitter is connected to the positive power source terminal VP. The collector of the transistor 124 is grounded through a resistor 126 and is also connected to the base of an npn transistor 128 whose collector is connected to the positive power source terminal VP. The emitter of the transistor 128 is connected to an output terminal of this circuit and is grounded through a capacitor 130. The emitter of the transistor 128 is also connected to the negative power source terminal VN through a resistor 132. The base of the transistor 114 is connected to the collector thereof. The base of the transistor 114 is also connected to the base of an npn transistor 134 whose emitter is connected to the negative power source terminal and whose collector is connected to the collector of the transistor 110.

In the level sensing cirucit shown in FIG. 3, the transistors 110 and 124 form a current mirror circuit, the transistors 114 and 134 form another current mirror circuit, and the capacitor 130 and the resistor 132 form a smoothing circuit. To the power source terminals VP and VN are respectively applied, for example, positive and negative DC voltages of the same absolute value.

The mode of operation of the level sensing circuit shown in FIG. 3 will be described below. First, it is assumed that the logarithmic amplifier 101 produces a positive output voltage V1 ($=\log|VIN|$) corresponding to the input signal VIN received through the resistor 102. Since the emitter voltage of the npn transistor 108 is positive in this case, this transistor is rendered nonconductive. On the other hand, since the emitter voltage of the pnp transistor 112 is positive, this transistor 112 is rendered conductive. Therefore, a current I1 ($=V1/R1$, where R1 is the resistance of the resistor 106) flows through the transistor 112. This current I1 also flows through the transistor 114. A current I11 of the same magnitude as that of the current I1 thus flows through the transistor 134. The current I11 also flows through the transistor 110, so that a current I12 equal to the current I11 flows through the transistor 124. Therefore, to the base of the transistor 128 is applied a base voltage VB1 given by the following equation:

$$VB1 = (R2/R1) \cdot V1 \qquad (1)$$

where R2 is the resistance of the resistor 126.

If $R2 = 2R1$, equation (1) may be rewritten as follows:

$$VB1 = 2V1 \qquad (2)$$

The base voltage of the transistor 128 has a magnitude twice that of the output voltage V1 ($>0$) of the logarithmic amplifier 100.

When a negative output voltage V2 is produced from the logarithmic amplifier 101, the transistor 108 is rendered conductive and the transistor 112 is rendered nonconductive. A current I2 ($=|V2|/R3$, where R3 is the resistance of the resistor 104) flows through the transistor 108. This current I2 also flows through the transistor 110, so that a current I21 equal to the current I2 flows through the transistor 124. In this case, to the base of the transistor 128 is applied a base voltage VB2 given by the following equation:

$$VB2 = (R2/R3) \cdot |V2| \qquad (3)$$

If $R2 = 2R3$, equation (3) may be rewritten as follows:
$$VB2 = 2|V2| = -2V2 \qquad (4)$$

The base voltage of the transistor 128 thus has a magnitude which is equal to a value obtained by multiplying the magnitude of the output voltage V2 ($<0$) of the logarithmic amplifier 100 by $-2$.

Thus, in the circuit shown in FIG. 3, when the output voltage from the logarithmic amplifier 101 is positive or negative, a voltage obtained by multiplying this output voltage by $+2$ or $-2$ is applied to the transistor 128.

Figure 4:
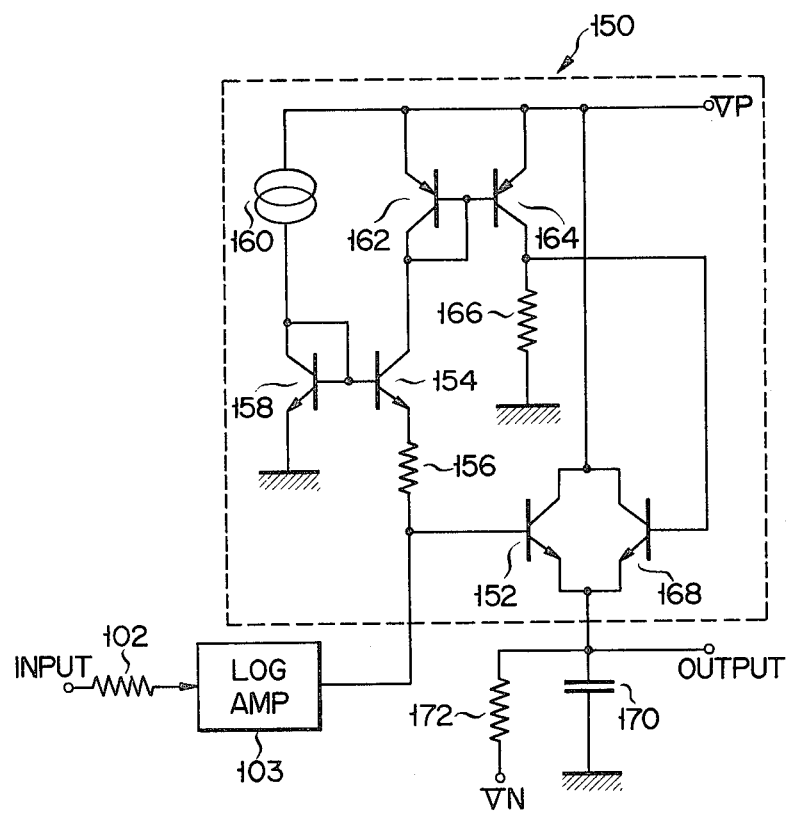
FIG. 4 is a circuit diagram of a level sensing circuit having a full-wave rectifying circuit according to another embodiment of the present invention.

FIG. 4 shows a circuit diagram of a level sensing circuit which a full-wave rectifying circuit 150 according to another embodiment of the present invention. In this circuit, a logarithmic amplifier 103 produces an output voltage which is twice the common logarithm $\log|VIN|$ ($=V1$) of the input voltage VIN. The output terminal of the logarithmic amplifier 103 is connected to the base of an npn transistor 152 as well as to the emitter of an npn transistor 154 through a resistor 156. The base of the transistor 154 is connected to the base of an npn transistor 158 whose emitter is grounded. The collector of the transistor 158 is connected to the base thereof, as well as to the positive power source terminal VP through a constant current source 160. The collector of the transistor 154 is connected to the collector of a pnp transistor 162 whose emitter is connected to the positive power source terminal VP. The base of the transistor 162 is connected to the collector thereof, as well as to the base of a pnp transistor 164 whose emitter is connected to the positive power source terminal VP. The collector of the transistor 164 is grounded through a resistor 166 and is also connected to the base of an npn transistor 168. The collector of the transistor 168 is connected to the collector of the transistor 152 as well as to the positive power source terminal VP. The emitter of the transistor 168 is grounded through a capacitor 170 together with the emitter of the transistor 152. These emitters are also connected to the negative power source terminal VN through a resistor 172.

In this circuit, the transistor 162 and 164 form a current mirror circuit, and the capacitor 170 and the resistor 172 form a smoothing circuit. The resistors 156 and 166 have the same resistance R4.

When a positive output voltage 2V1 is produced by the logarithmic amplifier 103, the emitter voltage of the npn transistor 154 becomes positive, so that the transistor 154 is rendered nonconductive and the transistor 152 receives at its base a positive bias voltage. When a negative output voltage 2V2 is produced by the logarithmic amplifier 103, the transistor 152 is rendered nonconductive and transistor 154 is rendered conductive; and a current I3 ($=|2V2|/R4$) flows through the transistor 154. This current I3 also flows through the transistor 162, so that a current I31 equal to the current I3 flows through the transistor 164. This current I31 flows through the resistor 166 to apply a base voltage $|2V2|$ or $-2V2$ to the base of the transistor 168. In this manner, according to whether the output voltage from the logarithmic amplifier 103 is positive or negative, a bias voltage having a magnitude equal to the absolute value of this output voltage is selectively applied to the bases of the transitors 152 and 168.

Although the present invention has been described with particular reference to the embodiments described above, the present invention is by no means limited to this. For example, in the circuit shown in FIG. 3, the resistor 126 was described as having resistance which is twice the resistance of either of the resistors 104 and 106. However, if the logarithmic amplifier 103 producing an output signal $2\log|VIN|$ is used in place of the logarithmic amplifier 101, or if the full-wave rectifying circuit 100 is to be used for other purposes, the resistances of the resistors 104, 106 and 126 may be set to be the same, for example.

What is claimed is:

1. A full-wave rectifying circuit comprising:
an input terminal for receiving an input signal;
a reference potential terminal;
a first current conducting path, connected to said input terminal, with means for conducting a first current corresponding to a signal component of a first polarity of said input signal;
a first resistor coupled at one end thereof to said reference potential terminal;
a second current conducting path, connected to said input terminal, with means for conducting a second current corresponding to a signal component of a second polarity opposite to said first polarity, of the input signal; and
a first current mirror circuit having a first current mirror path coupled to said first and second current connecting paths and a second current mirror path coupled to the other end of said resistor for causing a current flow in said resistor equal to the absolute value of the combined currents flowing through said first and second connecting paths.

2. A full-wave rectifying circuit according to claim 1, wherein said second current conducting path means comprises a second resistor, a first transistor having an emitter-collector path connected in series with said second resistor and a base maintained at a substantially constant potential, and a second current mirror circuit having a third current mirror path connected to said input terminal through said second resistor and said emitter-collector path of said first transistor, and a fourth current mirror path connected to the first current path of said first current mirror circuit.

3. A full-wave rectifying circuit according to claim 1 or 2, wherein said first current conducting path means has a third resistor and a second transistor having an emitter-collector path connected in series with said third resistor and a base maintained at a substantially constant potnetial.

4. A full-wave rectifying circuit according to claim 3, wherein said first resistor has a resistance twice that of either said second or said third resistor.

5. A full-wave rectifying circuit comprising:
an input terminal for receiving an input signal;
a reference potential terminal;
first and second current conducting paths which are connected to the input terminal to conduct currents corresponding to respective signal components of opposite polarities of the input signal supplied to the input terminal, said second current conducting path including a first transistor having a base connected to said input terminal;
a first resistor connected at a first end thereof to said reference potential terminal;
a first current mirror circuit having first and second current mirror paths which are respectively connected to said first current conducting path and a second end of said first resistor to conduct through said first resistor a current corresponding to a current flowing through said first current conducting path; and
a second transistor having a base connected to the second end of said first resistor and having an emitter-collector path connected in parallel with that of said first transistor.

6. A full-wave rectifying circuit according to claim 5, wherein said first current conducting path includes a second resistor and a third transistor having an emitter-collector path connected in series with said second resistor between said input terminal and said first current mirror path and having a base maintained at a substantially constant potential.

7. A full-wave rectifying circuit according to claim 6, wherein said first and second resistors have the same resistance.

8. A level sensing circuit comprising:
logarithmic amplifying means for producing an output signal corresponding to the logarithm of an input signal;
first and second current conducting paths connected to an output terminal of said logarithmic amplifying means for conducting currents corresponding to signal components of opposite polarities of an output signal from said logarithmic amplifying means;
a first resistor connected at a first end thereof to a reference terminal;
a current mirror circuit which is connected to said first and second current conducting paths and a second end of said first resistor to conduct through said first resistor a current corresponding to the absolute value of a combination of currents flowing through said first and said second current conducting paths; and
a smoothing circuit which is connected to said first resistor to smooth a voltage signal produced from said first resistor.

9. A level sensing circuit according to claim 8, wherein each of said first and second current conducting paths includes a further resistor and a transistor having an emitter-collector path connected in series with said further resistor between the output terminal of said logarithmic amplifying means and said current mirror circuit.

10. A level sensing circuit according to claim 9, wherein said current mirror circuit has a first current mirror section having first and second current mirror paths which are respectively connected to said first current conducting path and said first resistor, and a second current mirror section having second and third current mirror paths which are respectively connected to said second current conducting path and said first current mirror path.

11. A level sensing circuit according to claim 8 or 9, wherein said first resistor has a resistance twice that of said resistor of either said first or said second current path.

* * * * *